(12) United States Patent
Srivastava et al.

(10) Patent No.: US 10,211,172 B2
(45) Date of Patent: Feb. 19, 2019

(54) WAFER-BASED ELECTRONIC COMPONENT PACKAGING

(71) Applicant: Maxim Integrated Products, Inc., San Jose, CA (US)

(72) Inventors: Anuranjan Srivastava, Dublin, CA (US); Khanh Tran, Milpitas, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/317,613

(22) Filed: Jun. 27, 2014

(65) Prior Publication Data

US 2015/0262944 A1    Sep. 17, 2015

Related U.S. Application Data

(60) Provisional application No. 61/952,225, filed on Mar. 13, 2014.

(51) Int. Cl.
| | |
|---|---|
| H01L 23/00 | (2006.01) |
| H01L 23/31 | (2006.01) |
| H01L 21/56 | (2006.01) |

(52) U.S. Cl.
CPC ............ H01L 24/01 (2013.01); H01L 21/56 (2013.01); H01L 23/3185 (2013.01);
(Continued)

(58) Field of Classification Search
USPC ........... 257/E23.02, E25.023, 678, 734, 787; 438/109
See application file for complete search history.

(56) References Cited

U.S. PATENT DOCUMENTS

| | | | | |
|---|---|---|---|---|
| 5,545,921 A | * | 8/1996 | Conru ................. | H01L 23/4951 257/669 |
| 6,396,131 B1 | * | 5/2002 | Kinsman ............ | H01L 23/4951 257/669 |

(Continued)

FOREIGN PATENT DOCUMENTS

| | | |
|---|---|---|
| CN | 102077341 A | 5/2011 |
| CN | 103094231 A | 5/2013 |

OTHER PUBLICATIONS

Office Action for Chinese Application No. 201510105214.X, dated Jul. 4, 2018.

*Primary Examiner* — Telly Green
(74) *Attorney, Agent, or Firm* — Kevin E. West; Advent, LLP

(57) ABSTRACT

A surface mount device includes at least one semiconductor device including an exposed top metal, an encapsulation layer partially encapsulating the at least one semiconductor device, and at least one end-termination cap on the surface mount device resulting in an electrical connection from a first side of the surface mount device to a second side of the surface mount device. In implementations, one process for fabricating the surface mount device includes dicing a finished device wafer in a scribe-line region, applying tape to a first side of the finished device wafer, backgrinding a second side of the finished device wafer, encapsulating the second side of the finished device wafer with an encapsulation layer, singulating the finished device wafer, and forming at least one wrap-around connection from a first side of the surface mount device to a second side of the surface mount device.

7 Claims, 6 Drawing Sheets

(52) U.S. Cl.
CPC .............. *H01L 24/24* (2013.01); *H01L 24/96* (2013.01); *H01L 21/568* (2013.01); *H01L 2224/02371* (2013.01); *H01L 2224/04105* (2013.01); *H01L 2224/18* (2013.01); *H01L 2924/181* (2013.01)

(56) References Cited

U.S. PATENT DOCUMENTS

| | | | | |
|---|---|---|---|---|
| 6,855,572 | B2* | 2/2005 | Jeung | H01L 23/3114 257/E23.02 |
| 6,949,407 | B2* | 9/2005 | Jeung | H01L 23/3114 257/E23.02 |
| 7,193,312 | B2* | 3/2007 | Boon | H01L 23/3114 257/690 |
| 7,208,335 | B2* | 4/2007 | Boon | H01L 21/4846 257/E23.061 |
| 7,271,027 | B2* | 9/2007 | Boon | H01L 23/3114 257/E23.061 |
| 7,276,387 | B2* | 10/2007 | Jeung | H01L 23/3114 257/690 |
| 7,304,375 | B2* | 12/2007 | Boon | H01L 23/3114 257/686 |
| 7,528,477 | B2* | 5/2009 | Jeung | H01L 23/3114 257/686 |
| 7,633,159 | B2* | 12/2009 | Boon | H01L 21/4846 257/678 |
| 7,679,179 | B2* | 3/2010 | Jeung | H01L 23/3114 257/686 |
| 8,008,126 | B2* | 8/2011 | Jeung | H01L 23/3114 257/E21.499 |
| 8,063,493 | B2* | 11/2011 | Boon | H01L 21/4846 257/685 |
| 2004/0043535 | A1* | 3/2004 | Jeung | H01L 23/3114 438/109 |
| 2005/0067680 | A1* | 3/2005 | Boon | H01L 21/4846 257/678 |
| 2005/0104165 | A1* | 5/2005 | Ishio | H01L 23/3114 257/659 |
| 2005/0130345 | A1* | 6/2005 | Jeung | H01L 23/3114 438/106 |
| 2006/0001142 | A1* | 1/2006 | Jeung | H01L 23/3114 257/686 |
| 2006/0001143 | A1* | 1/2006 | Boon | H01L 23/3114 257/686 |
| 2006/0006519 | A1* | 1/2006 | Jeung | H01L 23/3114 257/686 |
| 2006/0006521 | A1* | 1/2006 | Boon | H01L 21/4846 257/701 |
| 2006/0008946 | A1* | 1/2006 | Jeung | H01L 23/3114 438/109 |
| 2006/0014319 | A1* | 1/2006 | Jeung | H01L 23/3114 438/109 |
| 2008/0067675 | A1* | 3/2008 | Jeung | H01L 23/3114 257/737 |
| 2010/0068851 | A1* | 3/2010 | Jeung | H01L 23/3114 438/109 |
| 2010/0072603 | A1* | 3/2010 | Boon | H01L 21/4846 257/690 |
| 2011/0089557 | A1* | 4/2011 | Shau | H01L 21/561 257/693 |
| 2011/0119338 | A1* | 5/2011 | Chen | G06Q 10/10 709/206 |
| 2011/0133337 | A1* | 6/2011 | Shau | H01L 21/561 257/738 |
| 2011/0180897 | A1 | 7/2011 | Pieraerts et al. | |
| 2013/0105977 | A1* | 5/2013 | Hosseini | H01L 29/402 257/751 |
| 2013/0119538 | A1 | 5/2013 | McCarthy | |
| 2013/0187174 | A1* | 7/2013 | Tischler | H01L 33/50 257/80 |

* cited by examiner

WAFER-BASED ELECTRONIC COMPONENT PACKAGING

BACKGROUND

Over the years, packaging technologies have evolved to develop smaller, cheaper, more reliable, and more environmentally-friendly packages. For example, chip-scale packaging technologies have been developed that employ direct surface mountable packages. Some surface mountable packages include semiconductor devices such as passive components (e.g., capacitors, inductors, diodes, resistors, etc.) and integrated circuit dies. Capacitors are passive storage elements that are used in various integrated circuits and surface mount devices. For example, capacitors may be utilized to store charge, block direct current (DC), block noise, DC to DC conversion, alternating current (AC) to AC conversion, filtering, and so forth.

SUMMARY

A surface mount device and methods are described that include forming a wrap-around connection for terminal metallization of the surface mount device. The surface mount device may decrease its physical footprint while providing a less costly fabrication process and maintaining the benefits inherent in wafer-level packaging (e.g., lower cost, smaller package size, high pin count, etc.). In implementations, the surface mount device that employs example techniques in accordance with the present disclosure includes at least one semiconductor device including an exposed top metal, an encapsulation layer partially encapsulating the at least one semiconductor device, and at least one end-termination cap on the surface mount device resulting in an electrical connection from a first side of the surface mount device to a second side of the surface mount device. In implementations, one process for fabricating the surface mount device that employs example techniques in accordance with the present disclosure includes at least partially dicing a finished device wafer in a scribe-line region, applying tape to a first side (e.g., active side) of the finished device wafer, backgrinding a second side of the finished device wafer, encapsulating the second side of the finished device wafer with an encapsulation layer, singulating the finished device wafer into individual semiconductor devices and surface mount devices, and forming at least one wrap-around connection from a first side of the surface mount device to a second side of the surface mount device. In another implementation, a process for fabricating the surface mount device with a multiple-tier end termination cap that employs example techniques in accordance with the present disclosure includes dicing a finished device wafer in a scribe-line region, applying tape to a first side of the finished device wafer, backgrinding a second side of the finished device wafer, encapsulating the second side of the finished device wafer with an encapsulation layer, applying an adhesive to the second side of the finished device wafer, attaching a second finished device wafer (which also goes through the same partial dicing, backgrinding and encapsulation process as the first finished device wafer) to the adhesive, singulating the first finished device wafer and second finished device wafer into individual die, and forming at least one wrap-around connection from a first side of the individual die to a second side of the individual die.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Figure 1A:
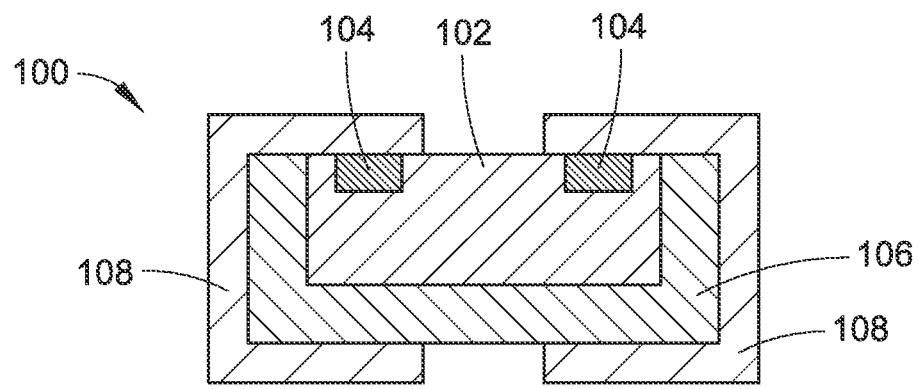
FIG. 1A is a diagrammatic cross-sectional view illustrating an embodiment of an surface mount device that includes a single-tier wrap-around end termination, in accordance with an example implementation of the present disclosure.

Semiconductor devices (e.g., capacitors, inductors, diodes, resistors, etc.) are suited for a wide variety of applications and can substantially displace existing discrete SMT components. Approaches for turning semiconductor devices into plug-n-play replacements of discrete SMT components can involve wafer level packaging-like (WLP) steps to add terminal metallization. Terminal metallization employs a low cost approach using well-established backend processing steps to package semiconductor devices in discrete form factors. Terminal metallization can have cost advantages over the WLP-like packaging solution above. Additionally, using terminal metallization allows easy stacking of two (or multiple) semiconductor devices in the same and/or similar discrete form factor, effectively doubling the value (e.g. capacitance density in the case of capacitors) with minimal complication. With some modification, this double-tier approach can be extended to realize additional layers of stacking.

As the number of computer applications grow, a greater amount of processing functionality and storage functionality provided by integrated circuitry is required. The greater amount of circuitry required correlates to a greater amount of physical space required in multi-media and electronic devices. A 3D die can be constructed using two or more layers of electronic components integrated into a single device, such as from stacking and processing semiconductor wafers. These electronic components may be stacked to form a single electrical circuit. Embedding silicon chips as well as passive components onto a semiconductor wafer device for 3D integration improves functionality and simplifies the fabrication process. Packages including multiple dies employ wire bonding or through silicon via/wafer level packaging technologies. While wire bonding adds to the size of the final package, wafer level packaging with through Si vias can be complex and costly.

Accordingly, a surface mount device and fabrication methods are described that include forming a wrap-around connection for terminal metallization of the surface mount device. The surface mount device minimizes its physical footprint while providing a less costly fabrication process and maintaining the benefits inherent in wafer-level packaging (e.g., lower cost, smaller package size, high pin count, etc.). In implementations, the surface mount device that employs example techniques in accordance with the present disclosure includes at least one semiconductor device with an exposed top metal, an encapsulation layer partially encapsulating the at least one semiconductor device, and at least one end-termination cap on the surface mount device resulting in an electrical connection from a first side of the surface mount device to a second side of the surface mount device. In implementations, one process for fabricating the surface mount device that employs example techniques in accordance with the present disclosure includes at least partially dicing a finished device wafer in a scribe-line region, applying tape to a first side (e.g., active side) of the finished device wafer, backgrinding a second side of the finished device wafer, encapsulating the second side of the finished device wafer with an encapsulation layer, singulating the finished device wafer into individual semiconductor devices, and forming at least one wrap-around connection from a first side of the surface mount device to a second side of the surface mount device. In another implementation, a process for fabricating a multiple-tier surface mount device with an end termination cap that employs example techniques in accordance with the present disclosure includes dicing a finished device wafer in a scribe-line region, applying tape to a first side of the finished device wafer, backgrinding a second side of the finished device wafer, encapsulating the second side of the finished device wafer with an encapsulation layer, applying an adhesive to the second side of the finished device wafer, attaching a second finished device wafer (which also goes through the same partial dicing, backgrinding and encapsulation process as the first finished device wafer) to the adhesive, singulating the first finished device wafer and second finished device wafer into individual die, and forming at least one wrap-around connection from a first side of the individual die to a second side of the individual die.

This surface mount device and fabrication method introduces a packaging flow that results in a smaller form factor package than wire bonding and is cheaper than using through-silicon-via technology. Encapsulation of each semiconductor device functions to insulate the side and back of the device, which prevents shorting from solder creep on the sides when the semiconductor device is a bare semiconductor. Additionally, the surface mount device can include stacked semiconductor devices using double-sided tape, which avoids multi-die wirebonding (which adds size and increases parasitics) and avoids through-silicon-vias (which can be complex and costly). Further, the surface mount device as disclosed minimizes component tilting from solder surface tension when assembled onto and/or coupled to a printed circuit board. The solder wicks around the three sides of the wrap-around end termination and results in an equilibrium that prevents the surface mount device from tilting.

Example Implementations

Figure 1B:
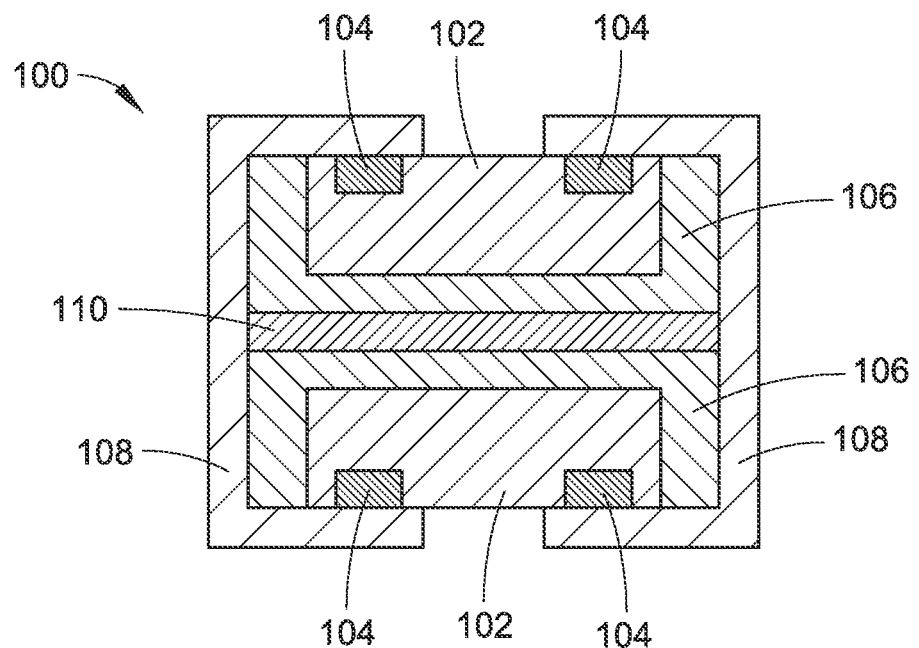
FIG. 1B is a diagrammatic cross-sectional view illustrating an embodiment of an surface mount device that includes a double-tier wrap-around end termination, in accordance with an example implementation of the present disclosure.
Figure 1C:
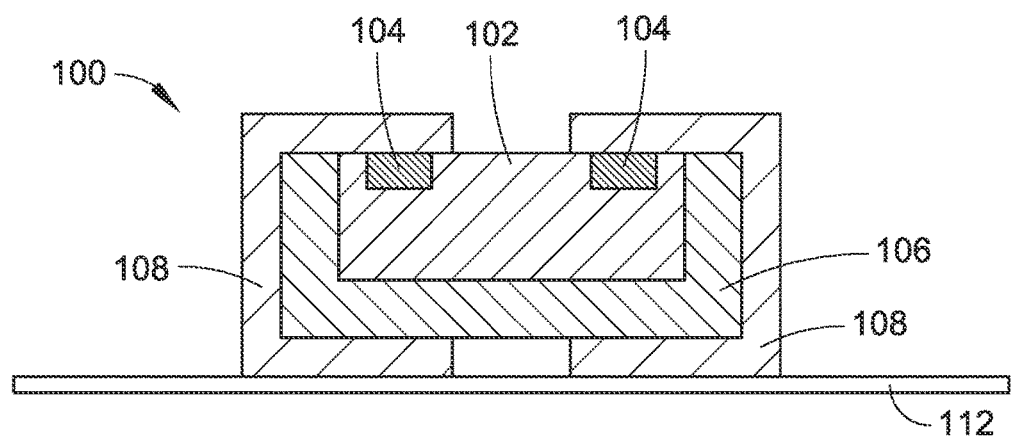
FIG. 1C is a diagrammatic cross-sectional view illustrating an embodiment of an surface mount device mounted to a printed circuit board, where the surface mount device includes a single-tier wrap-around end termination, in accordance with an example implementation of the present disclosure.

FIGS. 1A through 1B illustrate a surface mount device 100 in accordance with an example implementation of the present disclosure. As shown in FIG. 1A, the surface mount device 100 can include a single-tier configuration. This single tier configuration includes a semiconductor device 102. In some implementations, the semiconductor device 102 can include a semiconductor device 102 that has been formed from a finished semiconductor wafer, where the finished semiconductor wafer may have integrated circuits formed therein using back-end processes. The semiconductor device 102 may include digital integrated circuits, analog integrated circuits, mixed-signal circuits, and so forth. In one or more implementations, the semiconductor device 102 may include digital logic devices, analog devices (e.g., amplifiers, etc.), and combinations thereof, and so forth. As described above, the semiconductor device 102 may be fabricated utilizing various fabrication techniques. For example, the semiconductor device 102 may be fabricated via complimentary metal-oxide-semiconductor (CMOS) techniques, bi-polar semiconductor techniques, and so on. The semiconductor device 102 may include electrical interconnections formed therein (e.g., integrated circuits, redistribution layers, vias, contact pads, etc.). In implementations, the semiconductor device 102 can include an active die (e.g., a processor) and/or a passive die (e.g., a capacitor, a transistor, an inductor, a resistor, a diode, etc.). Additionally, the semiconductor device 102 can include electrical interconnections, such as top metal 104. The top metal 104 can include metal interconnections, such as contacts pads, as shown in FIGS. 1A and 1B. In implementations, a contact pad can include, for example, metal pads (e.g., copper, aluminum, etc.), under-ball metallization (UBM), etc., configured to provide an electrical connection between the semiconductor device 102 (by way of a redistribution layer, vias, and/or other electrical interconnections) and an external component (e.g., a printed circuit board).

As illustrated in FIGS. 1A and 1B, the surface mount device 100 includes an encapsulation layer 106 partially encapsulating the semiconductor device 102. In some implementations, the encapsulation layer 106 may encapsulate the semiconductor device 102 except for a side (e.g., an active side with the top metal) configured to have a portion of an end termination cap 108 formed thereon. The side of the semiconductor device 102 not encapsulated by the encapsulation layer 106 may include the side of the semiconductor device 102 having the top metal 104 formed thereon. The encapsulation layer 106 may include plastic-based compounds, for example, composite materials including epoxy resins, phenolic hardeners, silicas, catalysts, pigments, and/or mold release agents. The encapsulation layer 106 and molding compounds used for the surface mount devices, such as the surface mount device 100, may be selected to have a low moisture absorption rate, a high flexural strength at board-mounting temperatures, or a combination of both. In one specific embodiment, the encapsulation layer 106 includes an epoxy-based material.

As illustrated in FIGS. 1A and 1B, the surface mount device 100 includes an end termination cap 108. An end termination cap 108 can function as a sideways connection between a semiconductor device 102 and another electrical device (e.g., another semiconductor device 102 and/or printed circuit board 112, etc.). In implementations, an end termination cap 108 includes a wrap-around connection from a first side of the semiconductor device 102 having top metal 104 to a second side of the semiconductor device 102 and encapsulation layer 106, which is distal from the first side. In some embodiments, a metal dipping or a plating process can be used to form each end termination cap 106, which is further discussed below. The surface mount device 100 can include multiple end termination caps 108. In one example, a semiconductor device 102 can include two top metal 104 contact pads, each with a corresponding end termination cap 108. In another example, the semiconductor device 102 can include four top metals (104, each with a corresponding end termination cap 108. The end termination cap 108 can function to eliminate die tilting issues when mounting to a printed circuit board or other substrate. Additionally, forming an end termination cap 106 can serve to prevent the occurrence of solder fillet where solder creeps up the side of the surface mount device 100 when mounting to a printed circuit board or other substrate. This creeping solder and solder fillet can cause shorting of the surface mount device 102 through the printed circuit board or other substrate.

In an implementation illustrated in FIG. 1B, the surface mount device 100 can include a double-tier configuration. A double tier configuration can include multiple semiconductor devices 102 within the surface mount device 100. In implementations, a double tier surface mount device 100 includes one integrated circuit device 102 coupled to another integrated circuit device 102 with an adhesive 110 as well as a corresponding encapsulation layer 106. In embodiments, the adhesive 110 can include a double-sided tape configured to couple the first semiconductor device 102 and additional semiconductor device 102 together. For example, double-sided tape can be applied to a first semiconductor device 102 (e.g., on the side of the encapsulation layer 106 distal from the semiconductor device 102 side with the top metal 104), and a second semiconductor device 102 can be placed on the double-sided tape (e.g., the side of the second semiconductor device 102 with the encapsulation layer 106 contacting the double-sided tape). In some embodiments, the first semiconductor device 102 with an adhesive 110 can be attached to the second semiconductor device 102 while the semiconductor devices are still in wafer form and are unsingulated. In these embodiments, the semiconductor devices 102 are singulated subsequent to attachment. A surface mount device 100 with a double-tier configuration includes an end termination cap 108 that electrically connects a first semiconductor device 102 with another semiconductor device 102 by way of interconnection between the corresponding top metal 104 on each semiconductor device 102, such as the surface mount device 100 shown in FIG. 1B. For example, FIG. 1B illustrates an end termination cap 108 electrically connecting top metal 104 (e.g., a contact pad) of a first semiconductor device 102 with the top metal 104 (e.g., a contact pad) of a second semiconductor device 102. A double-tier configuration can increase the functionality of the surface mount device 100 while maintaining and/or decreasing the overall footprint of the surface mount device 100. The surface mount device 100 can then be coupled to another electronic device, such as a printed circuit board 112.

Example Processes

Figure 2:
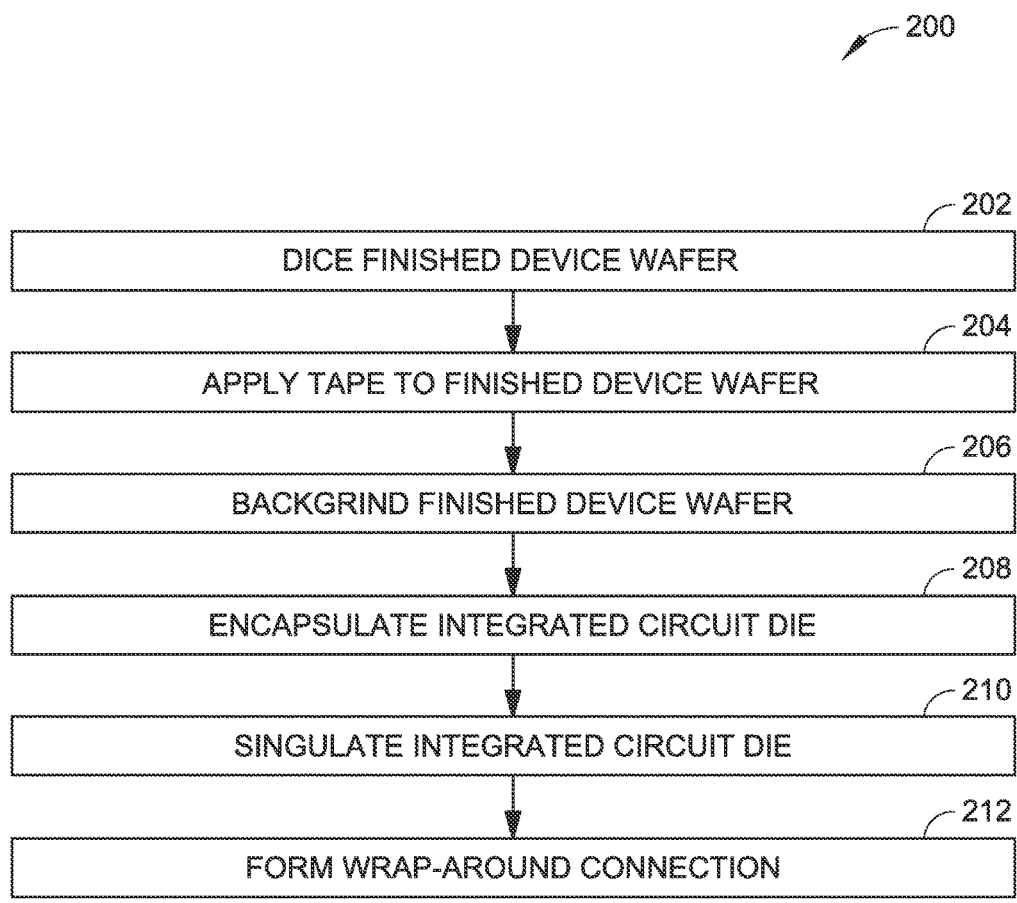
FIG. 2 is a flow diagram illustrating an example process for fabricating a surface mount device, such as the surface mount devices illustrated in FIGS. 1A and 1B.

FIG. 2 illustrates an example process 200 that employs a surface mount device, such as the surface mount device 300 shown in FIGS. 1A and 1B.

Figure 3A:
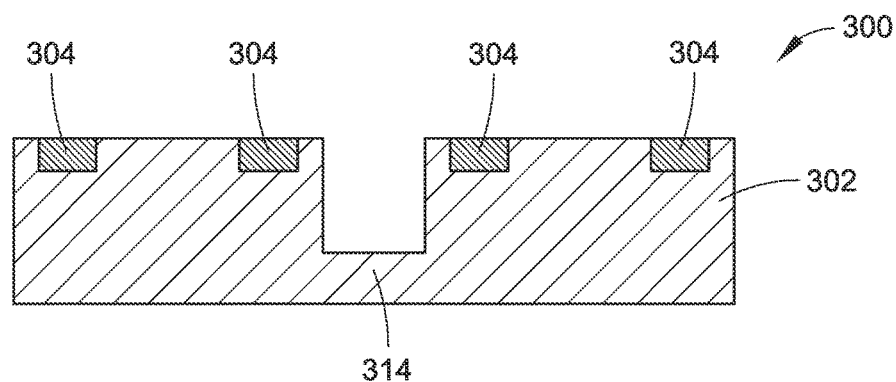
FIG. 3A is a diagrammatic partial cross-sectional side elevation view illustrating the fabrication of a surface mount device, such as the device shown in FIGS. 1A and 1B, in accordance with the process shown in FIG. 2.

In the process 200 illustrated, a finished device wafer is diced (Block 202). As shown in FIG. 3A, a finished device wafer 314 can be partially diced in a scribe-line region and/or a saw street. The finished device wafer 314 can include a wafer having circuits and electrical interconnections formed therein. In implementations, dicing the finished device wafer 314 can include using equipment used for singulating the die, such as a dicing saw equipped with a circular, diamond-plated dicing blade. In some embodiments, the finished device wafer 314 can be mounted in a frame and placed under the dicing saw (e.g., with the blades rotating from about 30,000 RPM to 60,000 RPM) to cut a slot through the space (e.g., a scribe-line region or a saw street) between the semiconductor device 302 die while using a dicing fluid/water mixture. In a specific implementation, the finished device wafer 314 is partially diced, for example, to approximately a 200 μm thickness.

Figure 3B:
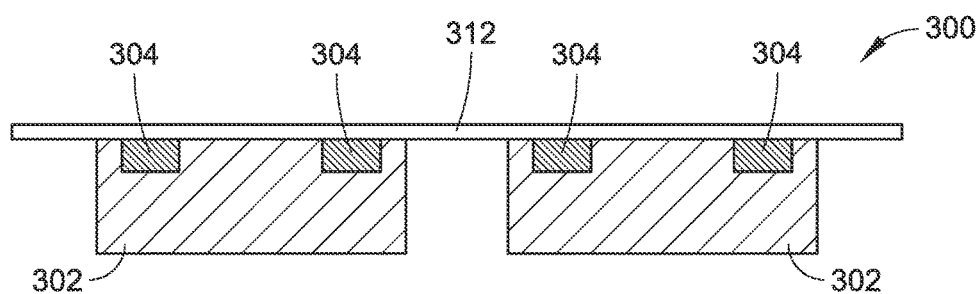
FIG. 3B is a diagrammatic partial cross-sectional side elevation view illustrating the fabrication of a surface mount device, such as the device shown in FIGS. 1A and 1B, in accordance with the process shown in FIG. 2.

A tape is applied on the finished device wafer (Block 204). As shown in FIG. 3B, tape 312 is applied to the front side of the finished device wafer 314 (e.g., the side of the finished device wafer 314 with the top metal 304 and/or electrical connections). In implementations, applying tape to the finished device wafer 314 can include applying tape 312 that provides support to each semiconductor device 302 during a subsequent backgrinding and encapsulation process, further discussed below. In some embodiments, the tape 312 can include a dicing tape, which can further include a base plastic film and an adhesive film. Some factors in determining the type of tape 312 used can include tack, adhesion, and other mechanical properties, with a goal to have an adhesion level high enough to hold and support the finished device wafer 314 and semiconductor device 302 during backgrinding and encapsulation processes.

Next, the finished device wafer is background (Block 206). As shown in FIG. 3B, a finished device wafer 314 is subjected to a backgrinding process to remove the backside of the finished device wafer 314 (e.g., the side of the finished device wafer 314 distal from the side with top metal 304 and tape 312). Backgrinding the finished device wafer 314 finishes the initial singulation process and segments the finished device wafer 314 into individual semiconductor device(s) 302 secured by tape 312 for subsequent encapsulation. Backgrinding the finished device wafer 314 can include using a process where a wafer and/or die is thinned using a grinding wheel using a precise set of parameters to ensure accurate thinning. In a specific embodiment, the finished device wafer 314 is background so that the approximately 200 μm of the finished device wafer 314 left during the dicing process is removed.

Figure 3C:
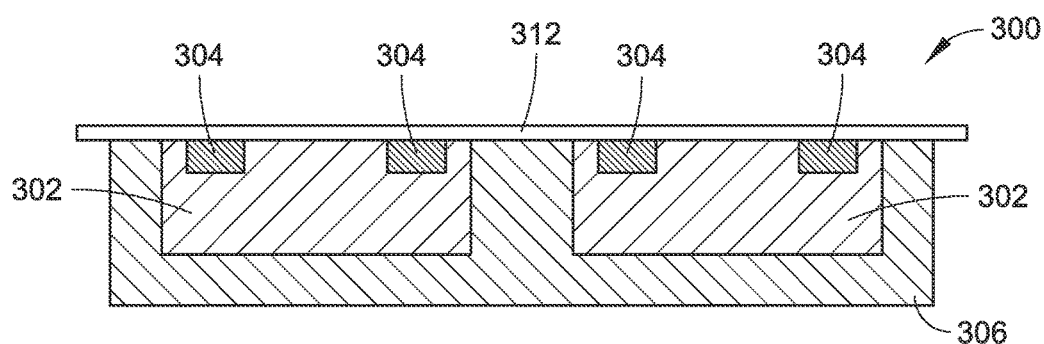
FIG. 3C is a diagrammatic partial cross-sectional side elevation view illustrating the fabrication of a surface mount device, such as the device shown in FIGS. 1A and 1B, in accordance with the process shown in FIG. 2.

Then, the semiconductor devices are encapsulated (Block 208). As illustrated in FIG. 3C, each semiconductor device 302 is encapsulated with an encapsulation layer 306. In implementations, placing an encapsulation layer 306 on each semiconductor device 302 can include placing a layer of encapsulation material on the backside of the semiconductor device 302 and the area that has been diced from the finished device wafer 314 (e.g., surrounding the semiconductor device 302 except the side having the top metal 304, electrical connections, and tape 312). Additionally, the encapsulation layer 306 can be placed and/or formed using processes such as compression molding, transfer molding, selective encapsulation, and/or other encapsulation processes. In some embodiments, the encapsulation material can include, epoxy-based materials, silicone, and/or polyurethane, for example. In a specific embodiment, a semiconductor device 302 is encapsulated with epoxy. Encapsulating the semiconductor device 302 can function to protect the semiconductor device 302 and electrically insulate the integrated circuit device 302 and sidewall silicon from other electrical components.

Figure 3D:
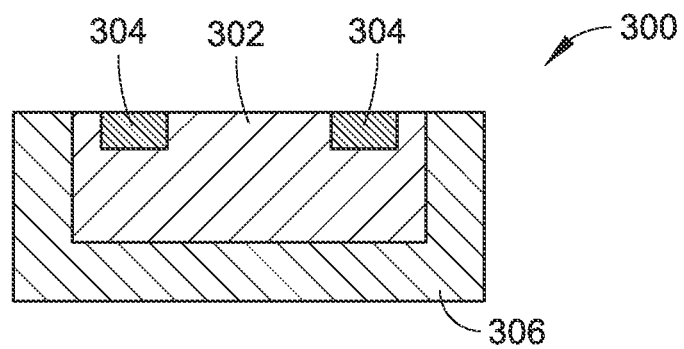
FIG. 3D is a diagrammatic partial cross-sectional side elevation view illustrating the fabrication of a surface mount device, such as the device shown in FIGS. 1A and 1B, in accordance with the process shown in FIG. 2.

Next, each semiconductor device is singulated (Block 210). In implementations, each encapsulated semiconductor device 302 can be singulated similar to the dicing step discussed above. A dicing saw may be used to singulate and separate each integrated circuit chip. In one embodiment and as shown in FIG. 3D, singulating a semiconductor device 302 can include using a dicing saw to cut through the encapsulation layer 306 and/or tape 312 in the area previously diced on the finished device wafer 314. In some implementations, the tape 312 may be removed prior to singulating the semiconductor device(s) 302 using an etching bath, a solvent, and/or a mechanical process.

Figure 3E:
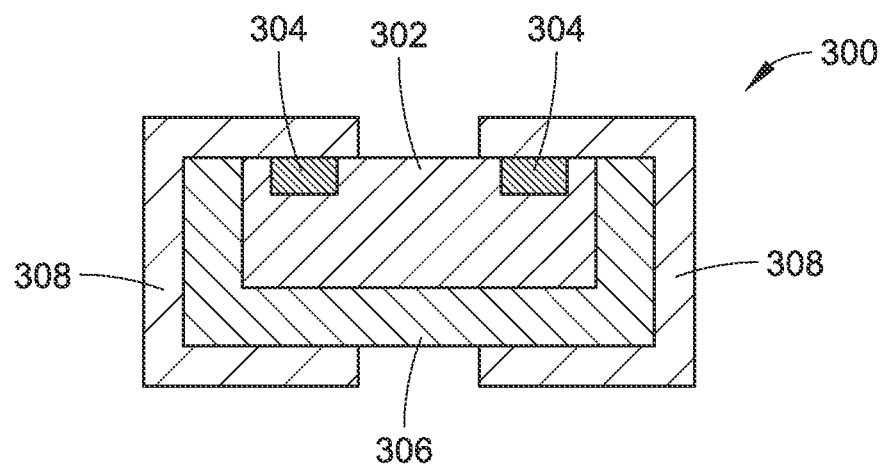
FIG. 3E is a diagrammatic partial cross-sectional side elevation view illustrating the fabrication of a surface mount device, such as the device shown in FIGS. 1A and 1B, in accordance with the process shown in FIG. 2.
Figure 3F:
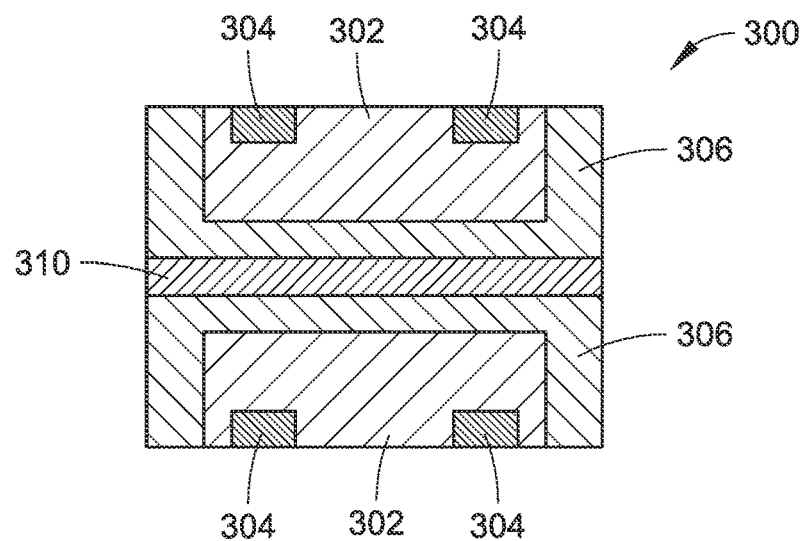
FIG. 3F is a diagrammatic partial cross-sectional side elevation view illustrating the fabrication of a surface mount device, such as the device shown in FIGS. 1A and 1B, in accordance with the process shown in FIG. 2.

In another implementation, a semiconductor device 302 may be coupled to another semiconductor device 302 to form a double-tier surface mount device 300, as illustrated in FIG. 3F. In this implementation, a first semiconductor device 302 can be coupled to another semiconductor device 302 using an adhesive 310, such as double-sided tape. In this implementation, a first encapsulated finished device wafer can be placed on a second finished device wafer having double-sided tape. The backside (e.g., side of the encapsulating layer 306 that is distal from the integrated circuit chip 302) of each semiconductor device 302 with the encapsulation layer 306 may be in contact with the adhesive 310.

Figure 3G:
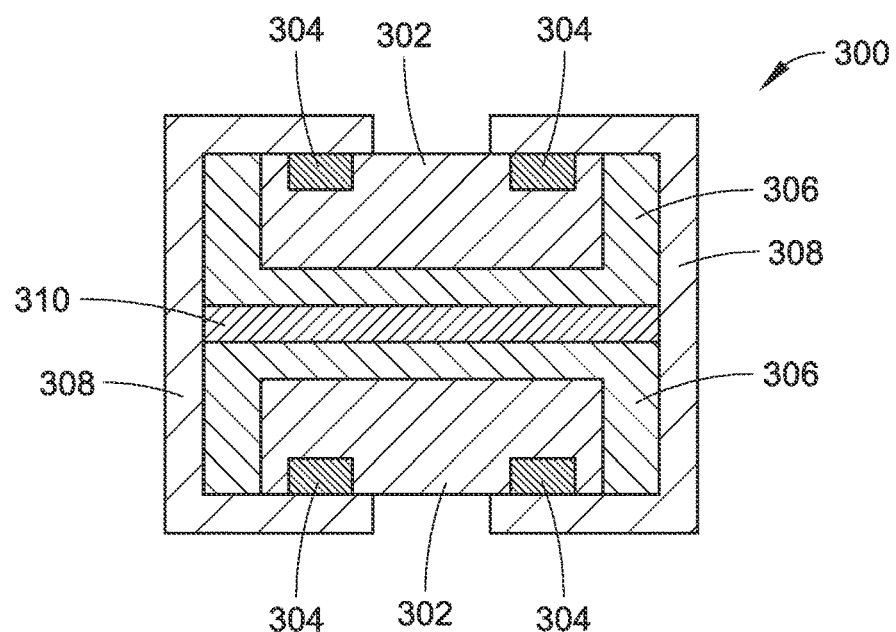
FIG. 3G is a diagrammatic partial cross-sectional side elevation view illustrating the fabrication of a surface mount device, such as the device shown in FIGS. 1A and 1B, in accordance with the process shown in FIG. 2.

Then, a wrap-around connection is formed (Block 212). In implementations, a wrap-around connection, or end termination cap 108, is formed on the surface mount device 300. Forming the end termination cap 308 can include utilizing a metal dipping and/or a plating process. In implementations, metal plating can include coating a substrate with a thin layer of metal, for example using electroplating. In one embodiment, forming an end termination cap 308 on the surface mount device 300 includes using a copper electroplating process. In other implementations, the end termination cap 308 can be formed by dipping a portion of the surface mount device 300 in a liquid metal. The end termination cap 308 can extend from a first side of the surface mount device 300 to a side distal or opposite the first side of the surface mount device 300, as shown in FIGS. 3E and 3G for a single-tier configuration and a double-tier configuration, respectively. Forming the wrap-around connection can function to provide a wrap-around end termination cap 308, prevent die-tilting when mounting to a printed circuit board or other substrate, and provide the appearance of a regular discrete surface mount device. In some implementations, the metal can include copper, aluminum, and/or a solder-based metal. It is contemplated that other metals and/or alloys may be used. In one specific embodiment, forming a wrap-around connection includes forming two end termination caps 308 such that each end termination cap 308 electrically couples a top metal 304 (e.g., a contact pad) to a corresponding top metal 304 on another device (e.g., another semiconductor device 302, a printed circuit board 112, etc.).

Following fabrication of the surface mount device 300 and system, the surface mount device 300 may be further processed and/or coupled with a printed circuit board 112 or other substrate to form an electronic device, which may be used in other systems, such as mobile phones and/or computing systems.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:
1. A surface mount device, comprising:
a semiconductor device including a first top metal contact and a second top metal contact, the first top metal contact and the second top metal contact disposed on a first side of the semiconductor device;
an encapsulation layer partially encapsulating the semiconductor device; and
a first end-termination cap disposed on the encapsulation layer and the semiconductor device, where the first end-termination cap is a wrap-around connection from the first top metal contact and the first side of the semiconductor device to a second side of the semiconductor device, the second side distal from the first side, the first end-termination cap directly contacting the semiconductor device and the first top metal contact on the first side, completely covering the first top metal contact, and further contacting the second side; and
a second end-termination cap disposed on the encapsulation layer and the semiconductor device, where the second end-termination cap is in a wrap-around connection from the second top metal contact and the first side to a second side of the semiconductor device, the second end-termination cap directly contacting the semiconductor device and the second top metal contact, completely covering the second top metal contact, and further contacting the second side, the second end-termination cap spaced from the first end-termination cap.

2. The surface mount device in claim 1, where the encapsulation layer encapsulates all but one side of the semiconductor device.

3. The surface mount device in claim 1, where the encapsulation layer includes at least one of an epoxy-based material, a plastics-based material, silicone, or polyurethane.

4. The surface mount device in claim 1, where the semiconductor device includes at least one of a capacitor, an inductor, a resistor, or a diode.

5. The surface mount device in claim 1, where the encapsulation layer encapsulates all but an active side of the semiconductor device, the active side including the first top metal contact and the second top metal contact.

6. The surface mount device in claim 1, where the second end-termination cap contacts the semiconductor device and the second top metal contact on the first side.

7. A surface mount device, comprising:
a semiconductor device including a first top metal contact and a second top metal contact, the first top metal contact and the second top metal contact disposed on a first side of the semiconductor device;
an encapsulation layer partially encapsulating the semiconductor device; and
a first end-termination cap disposed on the encapsulation layer and the semiconductor device, where the first end-termination cap is a wrap-around connection from the first top metal contact and the first side of the semiconductor device to a second side of the semiconductor device, the second side distal from the first side, the first end-termination cap directly contacting the semiconductor device and the first top metal contact on the first side, completely covering the first top metal contact, and further extending onto the second side; and
a second end-termination cap disposed on the encapsulation layer and the semiconductor device, where the second end-termination cap is in a wrap-around connection from the second top metal contact and the first side to a second side of the semiconductor device, the second end-termination cap directly contacting the semiconductor device and the second top metal contact, and completely covering the second top metal contact, and further extending onto the second side, the second end-termination cap spaced from the first end-termination cap.

* * * * *